US007681989B2

(12) United States Patent
Lee et al.

(10) Patent No.: US 7,681,989 B2

(45) Date of Patent: Mar. 23, 2010

(54) PIEZOELECTRIC ACTUATOR FOR AN INK-JET PRINTHEAD AND METHOD OF FORMING THE SAME

(75) Inventors: Hwa-sun Lee, Suwon-si (KR); Jae-woo Chung, Suwon-si (KR); Seung-mo Lim, Yongin-si (KR); Sung-gyu Kang, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 655 days.

(21) Appl. No.: 11/064,826

(22) Filed: Feb. 25, 2005

(65) Prior Publication Data

US 2005/0190241 A1 Sep. 1, 2005

(30) Foreign Application Priority Data

Feb. 27, 2004 (KR) ..................... 10-2004-0013561

(51) Int. Cl.
*B41J 2/16* (2006.01)
*H01L 41/24* (2006.01)
*B41J 2/45* (2006.01)

(52) U.S. Cl. .......................... 347/50; 347/70; 29/25.35

(58) Field of Classification Search .................. 347/68, 347/50

See application file for complete search history.

(56) References Cited

U.S. PATENT DOCUMENTS 5,889,539 A * 3/1999 Kamoi et al. ................. 347/70
6,336,717 B1 * 1/2002 Shimada et al. ............... 347/71
6,502,928 B1 * 1/2003 Shimada et al. ............... 347/68
7,044,586 B2 * 5/2006 Takeuchi et al. .............. 347/68
7,121,650 B2 * 10/2006 Chung et al. .................. 347/68
7,226,151 B2 * 6/2007 Murai ......................... 347/68
7,407,270 B2 * 8/2008 Furuhata ...................... 347/58
2006/0066677 A1 * 3/2006 Hori ............................ 347/50

FOREIGN PATENT DOCUMENTS

EP 0 561 616 A2 9/1993
EP 0 561 616 A3 9/1993
EP 0 615 294 A1 9/1994
EP 0 976 560 A2 2/2000
EP 0 976 560 A3 2/2000
EP 1 237 204 A2 9/2002
EP 1 237 204 A3 9/2002

* cited by examiner

*Primary Examiner*—Matthew Luu
*Assistant Examiner*—Shelby Fidler
(74) *Attorney, Agent, or Firm*—Lee & Morse, P.C.

(57) ABSTRACT

In a piezoelectric actuator for an ink-jet printhead, and a method of forming the same, formed on a flow path plate having a pressurizing chamber, the piezoelectric actuator for applying a driving force for ink ejection to the pressurizing chamber, the piezoelectric actuator includes a lower electrode formed on the flow path plate, a bonding pad formed on the flow path plate to be insulated from the lower electrode, wherein a driving circuit for voltage application is bonded to an upper surface of the bonding pad, a piezoelectric layer formed on the lower electrode at a position corresponding to the pressurizing chamber, wherein an end of the piezoelectric layer extends onto the bonding pad, and an upper electrode formed on the piezoelectric layer, wherein an end of the upper electrode extends beyond the end of the piezoelectric layer and contacts the upper surface of the bonding pad.

16 Claims, 11 Drawing Sheets

PIEZOELECTRIC ACTUATOR FOR AN INK-JET PRINTHEAD AND METHOD OF FORMING THE SAME

BACKGROUND OF THE INVENTION

1. Field of the Invention

The present invention relates to a piezoelectric ink-jet printhead. More particularly, the present invention relates to a piezoelectric actuator for generating a driving force to eject ink from a piezoelectric ink-jet printhead and a method of forming the same.

2. Description of the Related Art

Generally, an ink-jet printhead is a device that ejects small volume ink droplets at desired positions on a recording medium, thereby printing a desired color image. Ink-jet printheads are generally categorized into two types depending on which ink ejection mechanism is used. A first type is a thermal ink-jet printhead, in which ink is heated to form ink bubbles and the expansive force of the bubbles causes ink droplets to be ejected. A second type is a piezoelectric ink-jet printhead, in which a piezoelectric crystal is deformed to exert pressure on ink causing ink droplets to be ejected.

FIG. 1A illustrates a plan view of a conventional piezoelectric ink-jet printhead. FIG. 1B illustrates a vertical cross-sectional view taken along line I-I' of FIG. 1A.

Referring to FIGS. 1A and 1B, a flow path plate 10 having ink flow paths including a manifold 13, a plurality of restrictors 12, and a plurality of pressurizing chambers 11 is formed. A nozzle plate 20 having a plurality of nozzles 22 at positions corresponding to the respective pressurizing chambers 11 is formed on a lower side of the flow path plate 10. A piezoelectric actuator 40 is disposed on an upper side of the flow path plate 10. The manifold 13 is a common passage through which ink from an ink reservoir (not shown) is introduced into each of the plurality of pressurizing chambers 11. Each of the plurality of restrictors 12 is an individual passage through which ink from the manifold 13 is introduced into a respective pressurizing chamber 11. Each of the plurality of pressurizing chambers 11 is filled with ink to be ejected and collectively they may be arranged at one or both sides of the manifold 13. Volumes of each of the plurality of pressurizing chambers 11 change according to the driving of the piezoelectric actuator 40, thereby generating a change of pressure to perform ink ejection or introduction. To generate this change in pressure, an upper wall of each pressurizing chamber 11 of the flow path plate 10 serves as a vibrating plate 14 that can be deformed by the piezoelectric actuator 40.

The piezoelectric actuator 40 includes a lower electrode 41, piezoelectric layers 42, and upper electrodes 43, which are sequentially stacked on the flow path plate 10. A silicon oxide layer 31 is formed as an insulating film between the lower electrode 41 and the flow path plate 10. The lower electrode 41 is formed on the entire surface of the silicon oxide layer 31 and serves as a common electrode. The piezoelectric layers 42 are formed on the lower electrode 41 and are positioned at an upper side of each of the respective pressurizing chambers 11. The upper electrodes 43 are formed on the piezoelectric layers 42 and serve as driving electrodes for applying a voltage to the piezoelectric layers 42.

To apply a driving voltage to the above-described piezoelectric actuator 40, a flexible printed circuit (FPC) 50 for voltage application is connected to the upper electrodes 43. More specifically, wires 51 of the flexible printed circuit 50 are disposed on the upper electrodes 43 and then are heated and pressurized to bond the wires 51 to upper surfaces of the upper electrodes 43.

Referring to FIG. 1A, the pressurizing chambers 11 have a narrow and elongated shape. Accordingly, the piezoelectric layers 42 and the upper electrodes 43 similarly have a narrow and elongated shape. In view of this configuration, to firmly bond the wires 51 of the flexible printed circuit 50 to the upper electrodes 43, portions of the upper electrodes 43 to be bonded to the wires 51 must be sufficiently long. For example, in a conventional ink-jet printhead, lengths of the upper electrodes 42 are about twice as long as lengths of the pressurizing chambers 11.

Even though the piezoelectric layers 42 may have the same length as the pressurizing chambers 11, it is required that they have a greater length than the upper electrodes 43 to insulate the upper electrodes 43 and the lower electrode 41 and to support the upper electrodes 43. Resultantly, areas of the piezoelectric layers 42 are unnecessarily and disadvantageously increased. When the areas of the piezoelectric layers 42 are increased, a capacitance increases. Therefore, a load increases during driving the piezoelectric actuator 40 and a response speed of the piezoelectric actuator 40 decreases.

The upper electrodes 43 are generally formed by coating a conductive metal paste to a predetermined thickness onto upper surfaces of the piezoelectric layers 42 by screen printing followed by sintering. For this reason, the upper electrodes 43 have rough and coarse surfaces. Accordingly, even though a binding length between the upper electrodes 43 and the flexible printed circuit 50 may be sufficiently long, as described above, a binding force therebetween may be insufficient. As a result, there is a high likelihood that the upper electrodes 43 and the flexible printed circuit 50 may become separated when the actuator 40 is driven for a long time.

SUMMARY OF THE INVENTION

The present invention is therefore directed to a piezoelectric actuator for generating a driving force to eject ink from a piezoelectric ink-jet printhead and a method of forming the same, which substantially overcome one or more of the problems due to the limitations and disadvantages of the related art.

It is a feature of an embodiment of the present invention to provide a piezoelectric actuator for generating a driving force to eject ink from a piezoelectric ink-jet printhead, and a method of forming the same, that can increase a response speed of the piezoelectric actuator by reducing an area of a piezoelectric layer.

It is another feature of an embodiment of the present invention to provide a piezoelectric actuator for generating a driving force to eject ink from a piezoelectric ink-jet printhead, and a method of forming the same, that can be firmly and stably connected to a driving circuit for voltage application, thereby enhancing durability of a printhead.

At least one of the above and other features and advantages of the present invention may be realized by providing a piezoelectric actuator for an ink-jet printhead, formed on a flow path plate having a pressurizing chamber, the piezoelectric actuator for applying a driving force for ink ejection to the pressurizing chamber, the piezoelectric actuator including a lower electrode formed on the flow path plate, a bonding pad formed on the flow path plate to be insulated from the lower electrode, wherein a driving circuit for voltage application is bonded to an upper surface of the bonding pad, a piezoelectric layer formed on the lower electrode at a position corresponding to the pressurizing chamber, wherein an end of the piezoelectric layer extends onto the bonding pad, and an upper electrode formed on the piezoelectric layer, wherein an end of the upper electrode extends beyond the end of the piezoelectric layer and contacts the upper surface of the bonding pad.

The piezoelectric actuator may further include a trench bounding the bonding pad, the trench being formed to a predetermined depth in the flow path plate from an upper surface of the lower electrode, and a cavity formed at a bottom surface of the trench, wherein the bonding pad is insulated from the lower electrode by the trench and the cavity.

The cavity may have an approximately circular section.

The piezoelectric actuator may further include a trench bounding the bonding pad, the trench extending through the lower electrode, wherein the bonding pad is insulated from the lower electrode by the trench.

The piezoelectric actuator may further include an insulating layer between the flow path plate and the lower electrode.

The lower electrode and the bonding pad may be formed on a same plane using a same metal material. The lower electrode and the bonding pad may have a bi-layer structure composed of a sequentially stacked titanium (Ti) layer and platinum (Pt) layer.

The bonding pad may have a substantially square shape.

A width of the bonding pad may be greater than a width of the piezoelectric layer.

At least one of the above and other features and advantages of the present invention may be realized by providing a method of forming a piezoelectric actuator for an ink-jet printhead, formed on a flow path plate having a pressurizing chamber, the piezoelectric actuator for applying a driving force for ink ejection to the pressurizing chamber, the method including forming a lower electrode and a bonding pad insulated from the lower electrode on the flow path plate, forming a piezoelectric layer on the lower electrode at a position corresponding to the pressurizing chamber so that an end of the piezoelectric layer extends onto the bonding pad, and forming an upper electrode on the piezoelectric layer so that an end of the upper electrode extends beyond the end of the piezoelectric layer and contacts an upper surface of the bonding pad.

In a first embodiment of the present invention, forming the lower electrode and the bonding pad may include forming a first intermediate insulating layer on the flow path plate, patterning the first intermediate insulating layer to a predetermined pattern, etching a portion of the flow path plate exposed through the patterned first intermediate layer to a predetermined depth to form a trench, forming a second intermediate insulating layer on an inner surface of the trench, etching a portion of the second intermediate insulating layer formed on a bottom surface of the trench, etching an exposed portion of the flow path plate at the bottom surface of the trench to form a cavity having a width greater than a width of the trench, forming an insulating layer on an inner surface of the cavity, and depositing a conductive metal material on the insulating layer formed on the flow path plate to form the lower electrode beyond the trench and to form the bonding pad bounded by the trench and insulated from the lower electrode by the trench and the cavity. Etching the portion of the flow path plate exposed through the patterned first intermediate layer to a predetermined depth to form the trench may include anisotropically dry etching using Reactive Ion Etching (RIE). Etching the portion of the second intermediate insulating layer formed on the bottom surface of the trench may include anisotropically dry etching using Ion Beam Etching (IBE). Etching the exposed portion of the flow path plate at the bottom surface of the trench may include isotropic etching through the trench to form the cavity to have an approximately circular section. Forming the first and second intermediate insulating layers may include performing Plasma Enhanced Chemical Vapor Deposition (PECVD) and forming the insulating layer may include performing thermal oxidation.

In a second embodiment of the present invention, forming the lower electrode and the bonding pad may include forming an insulating layer on the flow path plate, depositing a conductive metal material on the insulating layer to form the lower electrode, and etching the lower electrode to a predetermined pattern to form a trench extending through the lower electrode to form the bonding pad that is bounded by the trench and insulated from the lower electrode by the trench.

Forming the lower electrode and the bonding pad may include sequentially stacking a bi-layer structure composed of a titanium (Ti) layer and a platinum (Pt) layer.

Forming the bonding pad may include forming the bonding pad to have a substantially square shape, wherein a width of the bonding pad is greater than a width of the piezoelectric layer.

Forming the piezoelectric layer may include screen printing a piezoelectric paste on an upper surface of the lower electrode at a position corresponding to the pressurizing chamber and a portion of an upper surface of the bonding pad, and sintering.

Forming the upper electrode may include screen printing a conductive metal paste on an upper surface of the piezoelectric layer and a portion of an upper surface of the bonding pad, and sintering.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
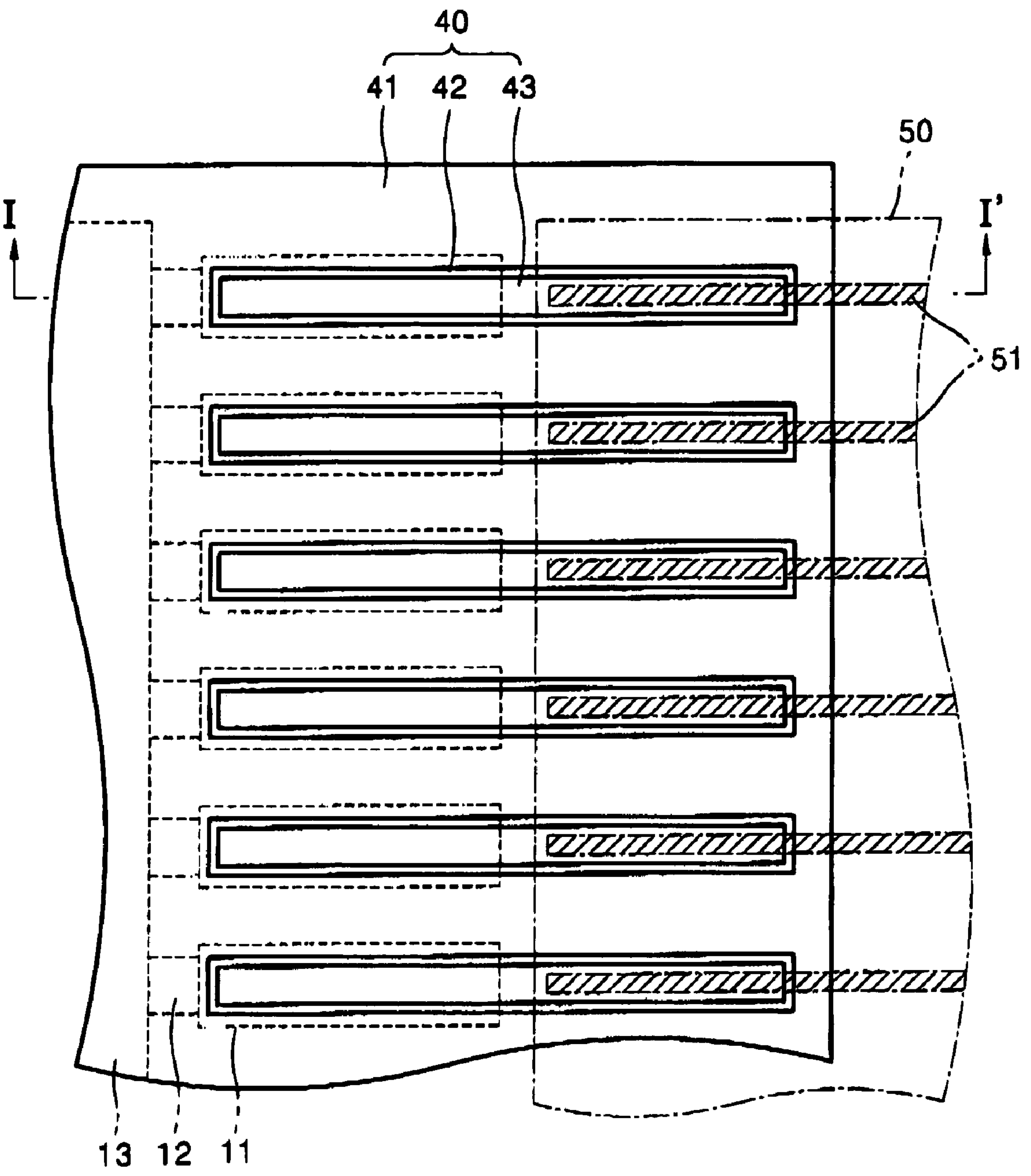
FIG. 1A (PRIOR ART)
FIG. 1A illustrates a plan view of a conventional piezoelectric ink-jet printhead and FIG. 1B illustrates a vertical cross-sectional view taken along line I-I' of FIG. 1A.
Figure 1B:
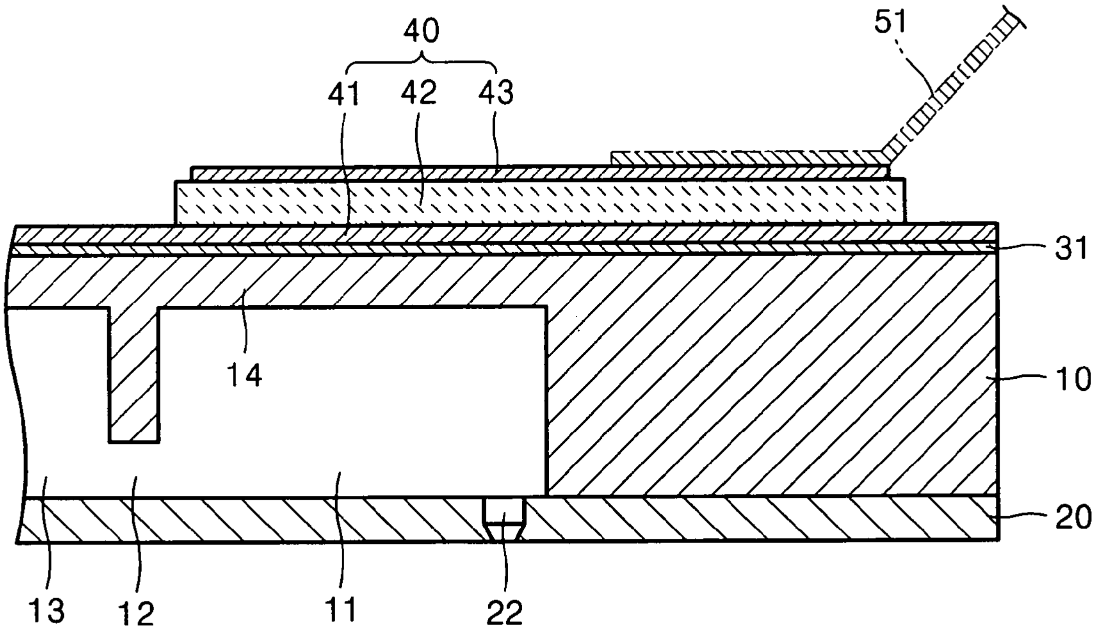
FIG. 1B (PRIOR ART)

Korean Patent Application No. 10-2004-0013561, filed on Feb. 27, 2004, in the Korean Intellectual Property Office, and entitled: “Piezoelectric Actuator for Ink-jet Printhead and Method of Forming the Same,” is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2A:
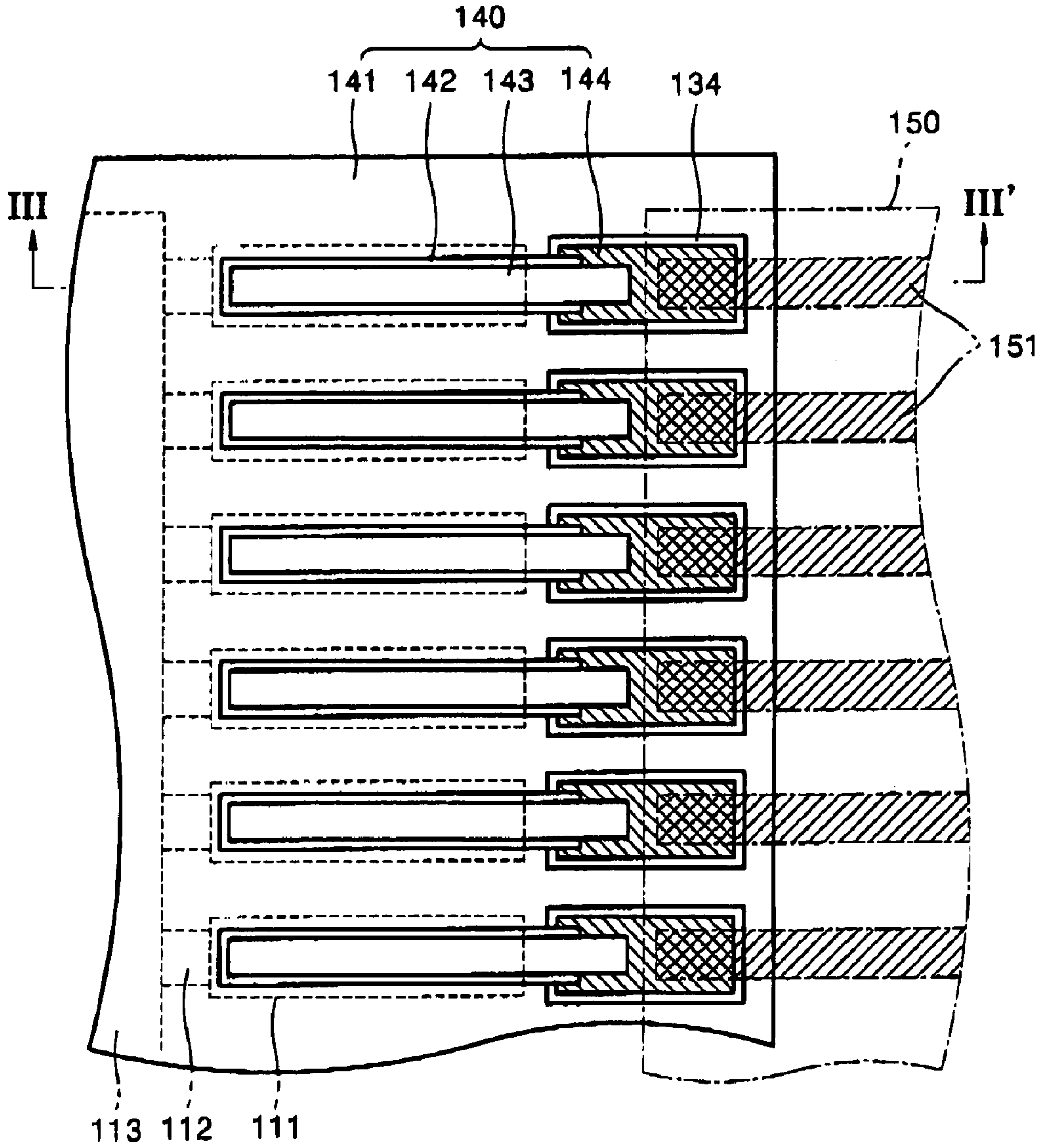
FIGS. 2A and 2B illustrate a plan view of a piezoelectric actuator for an ink-jet printhead according to a first embodiment of the present invention and a second embodiment of the present invention, respectively.
Figure 3:
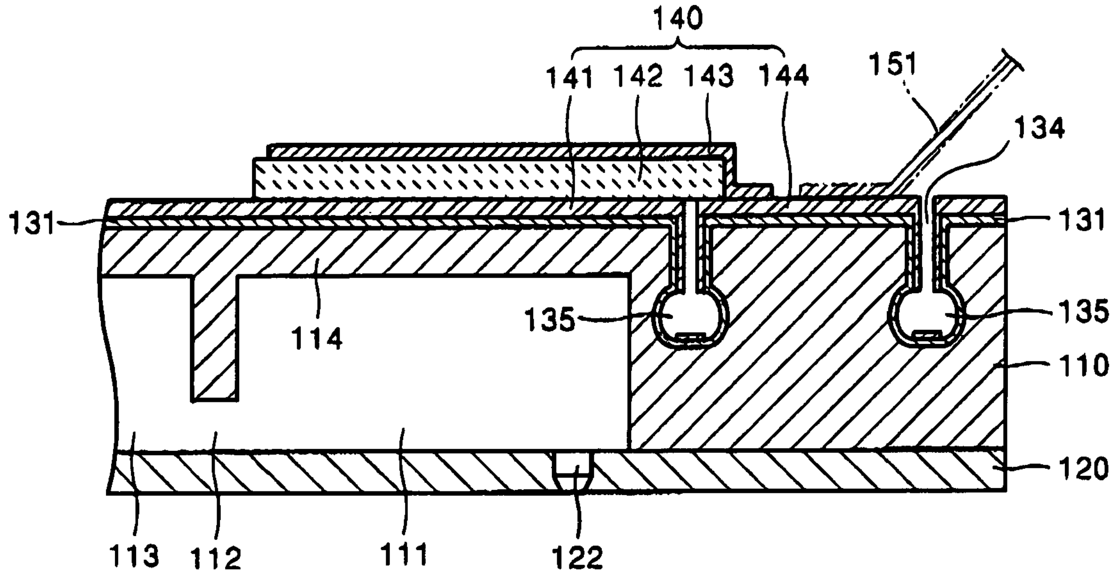
FIG. 3 illustrates a vertical cross-sectional view of the piezoelectric actuator according to the first embodiment of the present invention, taken along line III-III' of FIG. 2A.

FIG. 2A illustrates a plan view of a piezoelectric actuator for an ink-jet printhead according to a first embodiment of the present invention. FIG. 3 illustrates a vertical cross-sectional view of the piezoelectric actuator according to the first embodiment of the present invention, taken along line III-III' of FIG. 2A.

Referring to FIGS. 2A and 3, a piezoelectric actuator 140 of the ink-jet printhead according to the first embodiment of the present invention is formed on an upper surface of a flow path plate 110 having a plurality of pressurizing chambers 111 and serves to supply a driving force for ink ejection to the pressurizing chambers 111. The piezoelectric actuator 140 includes a lower electrode 141 used as a common electrode, piezoelectric layers 142 that are deformed by an applied voltage, and upper electrodes 143 used as driving electrodes. The piezoelectric actuator 40 has a sequentially stacked structure of the lower electrode 141, the piezoelectric layers 142, and the upper electrodes 143 on the flow path plate 110. In particular, the piezoelectric actuator 140 according to the present invention includes bonding pads 144 to electrically connect a driving circuit for voltage application to the upper electrodes 143.

As described above, a piezoelectric ink-jet printhead is formed to include ink flow paths. The ink flow paths may include the plurality of pressurizing chambers 111 to be filled with ink to be ejected, a manifold 113 and restrictors 112 for supplying ink to the pressurizing chambers 111, and nozzles 122 through which ink is ejected from the pressurizing chambers 111. These ink flow paths are formed in the flow path plate 110 and a nozzle plate 120. Further, vibrating plates 114, which can be deformed as the piezoelectric actuator 140 is driven, are disposed at upper portions of the pressurizing chambers 111.

The construction of the ink flow paths shown in the figures is exemplary and provided only for purposes of illustration. More specifically, a piezoelectric ink-jet printhead may have ink flow paths of various constructions and the ink flow paths may also be formed in three or more plates, instead of the two plates 110 and 120. In particular, the present invention relates to the construction of the piezoelectric actuator 140 disposed on the flow path plate 110 having the pressurizing chambers 111, not the construction of the ink flow paths.

The lower electrode 141 of the piezoelectric actuator 140 is formed on the flow path plate 110 having the pressurizing chambers 111. When the flow path plate 110 is a silicon wafer, an insulating layer 131, e.g., a silicon oxide layer, may be formed between the flow path plate 110 and the lower electrode 141. The lower electrode 141 is made of a conductive metal material. The lower electrode 141 may be formed as a metal monolayer. However, the lower electrode 141 may preferably be formed as a metal bi-layer composed of a sequentially stacked titanium (Ti) layer and platinum(Pt) layer. The lower electrode 141 made of Ti/Pt serves as a common electrode, and, at the same time, as a diffusion barrier layer for preventing inter-diffusion between the overlying piezoelectric layers 142 and the underlying flow path plate 110.

The bonding pads 144 are used to electrically connect the upper electrodes 143 and a driving circuit for voltage application, e.g., a flexible printed circuit 150. Wires 151 of the flexible printed circuit 150 are bonded to upper surfaces of the bonding pads 144. The bonding pads 144 are arranged adjacent to the pressurizing chambers 111. The bonding pads 144 are formed on a same plane as the lower electrode 141, i.e., on the silicon oxide layer 131, and are insulated from the lower electrode 141. The bonding pads 144 and the lower electrode 141 may be made of the same material, as will be subsequently described in connection with a method of forming the piezoelectric actuator. These bonding pads 144 are bounded by a trench 134, which is formed to a predetermined depth in the flow path plate 110 from an upper surface of the lower electrode 141. The trench 134, may have, e.g., a square shape. At this time, widths of the bonding pads 144 may be defined to be greater than widths of the upper electrodes 143, and preferably greater than widths of the piezoelectric layers 142. The bonding pads 144 may be insulated from the lower electrode 141 by the trench 134 and a cavity 135, which is additionally formed at a bottom surface of the trench 134. A detailed description thereof will be provided below in connection with the method of forming the piezoelectric actuator.

The piezoelectric layers 142 are formed on the lower electrode 141 at positions corresponding to the respective pressurizing chambers 111. An end of each of the piezoelectric layers 142 extends onto a corresponding one of the bonding pads 144. The piezoelectric layers 142 may be made of a piezoelectric material, and may preferably be made of a Lead Zirconate Titanate (PZT) ceramic material.

The upper electrodes 143 serve as driving electrodes for applying a voltage to the piezoelectric layers 142 and are formed on the piezoelectric layers 142. An end of each of the upper electrodes 143 extends beyond a corresponding end of a corresponding one of the piezoelectric layers 142 and contacts an upper surface of a corresponding one of the bonding pads 144. Resultantly, an end of each of the upper electrodes 143 is electrically connected to a corresponding one of the bonding pads 144.

In the piezoelectric actuator 140 according to the first embodiment of the present invention having the above-described structure, since the bonding pads 144 are formed on the flow path plate 110 to be insulated from the lower electrode 141, the upper electrodes 143 and the wires 151 of the flexible printed circuit 150 can be electrically connected by the bonding pads 144. Therefore, there is no need to increase the lengths of the piezoelectric layers 142, unlike in the case of a conventional piezoelectric actuator, thereby decreasing the areas of the piezoelectric layers 142. The reduction of the areas of the piezoelectric layers 142 decreases the capacitance and electric load of the piezoelectric layers 142. Therefore, the response speed and durability of the piezoelectric actuator 140 are enhanced. The enhanced response speed increases the ejection speed of ink droplets through the nozzles 122, thereby increasing a driving frequency.

The bonding pads 144 are made of a conductive material, e.g., a metal material, and thus, may have a smooth and dense surface structure. Accordingly, the bonding pads 144 and the flexible printed circuit 150 may be more firmly and stably bonded, thereby enhancing durability of a printhead. Furthermore, the bonding pads 144 may be formed wider than the upper electrodes 143, and thus, bonding areas between the bonding pads 144 and the flexible printed circuit 150 increase. Therefore, a bonding strength can be increased, and bonding between the bonding pads 144 and the flexible printed circuit 150 may be readily accomplished, as compared to a conventional piezoelectric actuator.

Figure 2B:
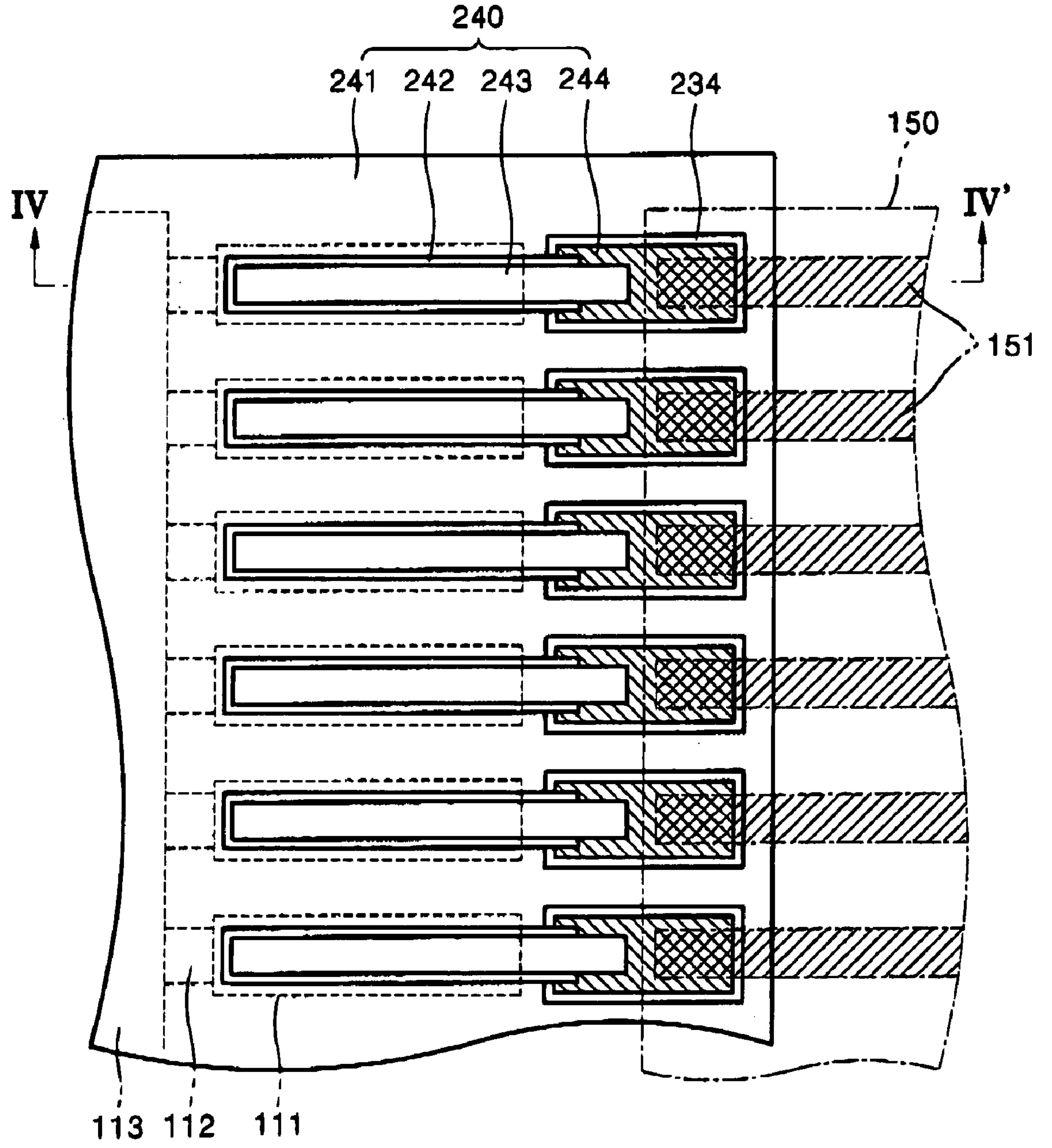
Figure 4:
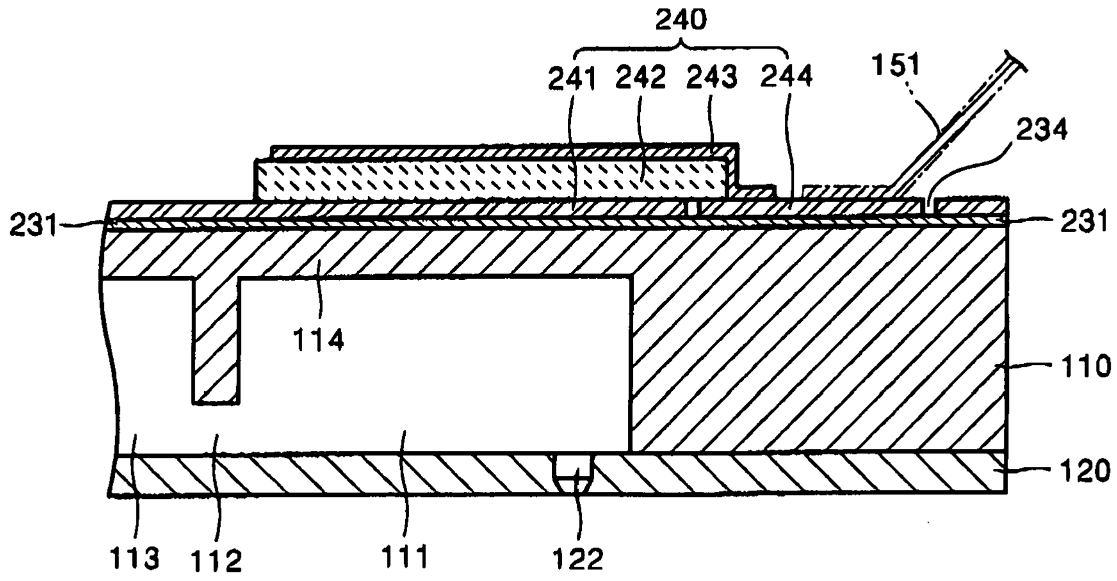
FIG. 4 illustrates a vertical cross-sectional view of the piezoelectric actuator according to the second embodiment of the present invention, taken along line IV-IV' of FIG. 2B.

FIG. 2B illustrates a plan view of a piezoelectric actuator for an ink-jet printhead according to a second embodiment of the present invention. FIG. 4 illustrates a vertical cross-sectional view of the piezoelectric actuator according to the second embodiment of the present invention, taken along line IV-IV' of FIG. 2B. The piezoelectric actuator according to the second embodiment is substantially the same as in the first embodiment except with respect to the structure of the trench bounding the bonding pad. Accordingly, descriptions of elements common to the first embodiment will be omitted or briefly provided.

Referring to FIGS. 2B and 4, a piezoelectric actuator 240 according to the second embodiment of the present invention includes a lower electrode 241 used as a common electrode, piezoelectric layers 242 that can be deformed by an applied voltage, upper electrodes 243 used as driving electrodes, and bonding pads 244 for electrically connecting a driving circuit for applying a voltage to the upper electrodes 243.

The lower electrode 241, which is formed on the flow path plate 110 having the pressurizing chambers 111, the manifold 113, and the restrictors 112, may be formed of a metal bi-layer composed of a sequentially stacked Ti layer and Pt layer. When the flow path plate 110 is made of silicon, an insulating layer 231, e.g. a silicon oxide layer, may be formed between the flow path plate 110 and the lower electrode 241, as described above in connection with the first embodiment.

The bonding pads 244 are used to electrically connect the upper electrodes 243 and the flexible printed circuit 150 for voltage application. Wires 151 of the flexible printed circuit 150 are bonded to upper surfaces of the bonding pads 244. The bonding pads 244 are arranged adjacent to the pressurizing chambers 111. The bonding pads 244 are formed on a same plane as the lower electrode 241, i.e., on the silicon oxide layer 231, and are insulated from the lower electrode 241. The bonding pads 244 and the lower electrode 241 may be made of the same material. According to the second embodiment of the present invention, the bonding pads 244 are bounded by a trench 234 extending through the lower electrode 241 and are insulated from the lower electrode 241 by the trench 234. The trench 234 may have, e.g., a square shape. The bonding pads 244 may be formed wider than the upper electrodes 243, and preferably wider than the piezoelectric layers 242.

As described above, in the piezoelectric actuator 240 according to the second embodiment of the present invention, the trench 234 used to insulate the bonding pads 244 from the lower electrode 241 is formed only in the lower electrode 241, unlike in the first embodiment, in which the trench 134 extends through the silicon oxide layer 131 and into the flow path plate 110.

The piezoelectric layers 242 are formed on the lower electrode 241 at positions corresponding to the respective pressurizing chambers 111. An end of each of the piezoelectric layers 242 extends onto a corresponding one of the bonding pads 244.

The upper electrodes 243 are formed on the piezoelectric layers 242. An end of each of the upper electrodes 243 extends beyond a corresponding end of a corresponding one of the piezoelectric layers 242 and contacts an upper surface of a corresponding one of the bonding pads 244.

In the piezoelectric actuator 240 according to the second embodiment of the present invention having the above-described structure, the bonding pads 244 and the lower electrode 241 may be more readily insulated. The piezoelectric actuator 240 according to the second embodiment of the present invention exhibits the same advantages as the first embodiment, and thus, a detailed description thereof will not be repeated.

Hereinafter, methods of forming piezoelectric actuators for ink-jet printheads according to the embodiments of the present invention will now be described with reference to the accompanying drawings.

FIGS. 5A through 5J illustrate cross-sectional views of sequential stages in a method of forming the piezoelectric actuator according to the first embodiment of the present invention shown in FIG. 3.

Figure 5A:
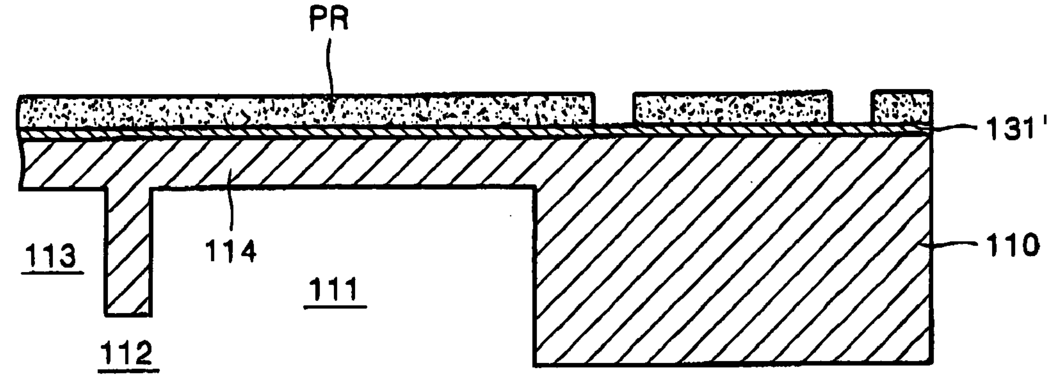
FIGS. 5A through 5J illustrate cross-sectional views of sequential stages in a method of forming the piezoelectric actuator according to the first embodiment of the present invention shown in FIG. 3.

Referring to FIG. 5A, initially, the flow path plate 110 including ink flow paths, e.g., the pressurizing chamber 111, the manifold 113, the restrictor 112, and the vibrating plate 114 is prepared. The flow path plate 110 may be prepared by forming the ink flow paths, including the pressurizing chamber 111, etc., by etching a silicon wafer to a predetermined depth from a lower surface of the silicon wafer.

A first intermediate insulating layer 131', e.g., a silicon oxide layer, is formed on an upper surface of the thus-prepared flow path plate 110. More specifically, the silicon oxide layer 131' may be formed by Plasma Enhanced Chemical Vapor Deposition (PECVD).

A photoresist PR is then coated on the entire surface of the silicon oxide layer 131' and patterned to a predetermined pattern. The patterning of the photoresist PR may be performed by a known photolithography process including exposure and development. The photoresist PR is patterned according to the shape of the trenches 134 shown in FIG. 2A.

Figure 5B:
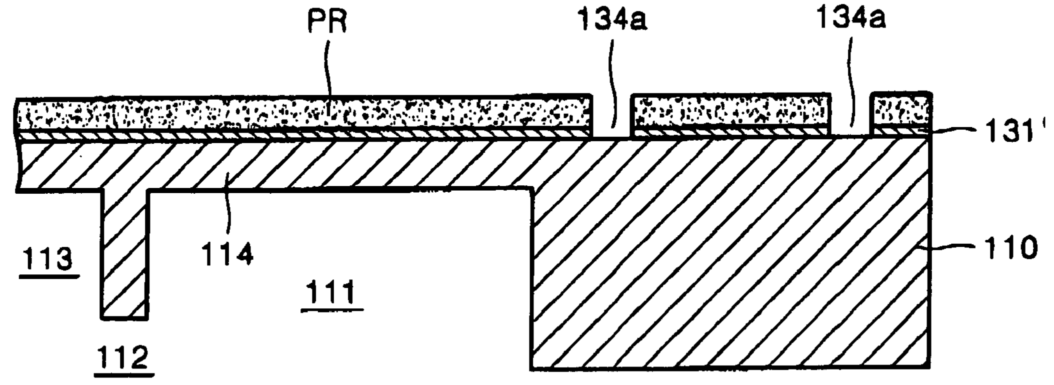

Referring to FIG. 5B, the silicon oxide layer 131' is then etched using the patterned photoresist PR as an etching mask to form an opening 134*a* intended for trench formation.

Figure 5C:
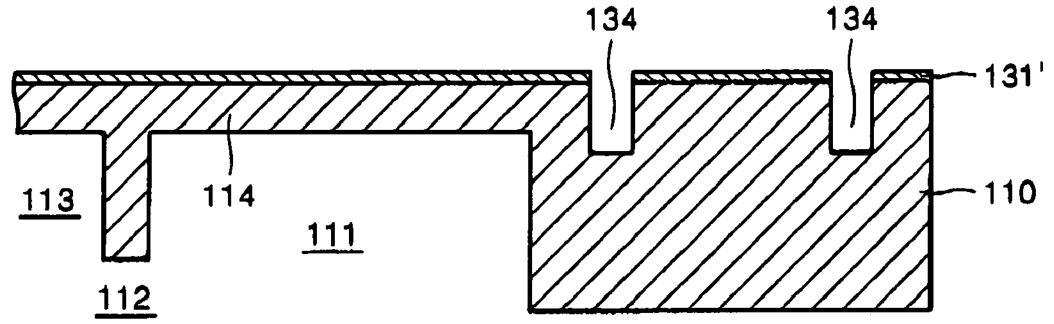

FIG. 5C illustrates the flow path plate 110 having the trench 134 formed therein. More specifically, the photoresist PR is stripped and then the flow path plate 110 is etched to a predetermined depth using the silicon oxide layer 131' as an etching mask to form the trench 134. The etching of the flow path plate 110 may be performed by anisotropic dry etching, e.g., Reactive Ion Etching (RIE).

FIG. 5C illustrates a case where the flow path plate 110 is etched using the silicon oxide layer 131' as an etching mask, after the photoresist PR is stripped. Alternatively, the photoresist PR may be stripped after the flow path plate 110 is etched using the photoresist PR as an etching mask.

Figure 5D:
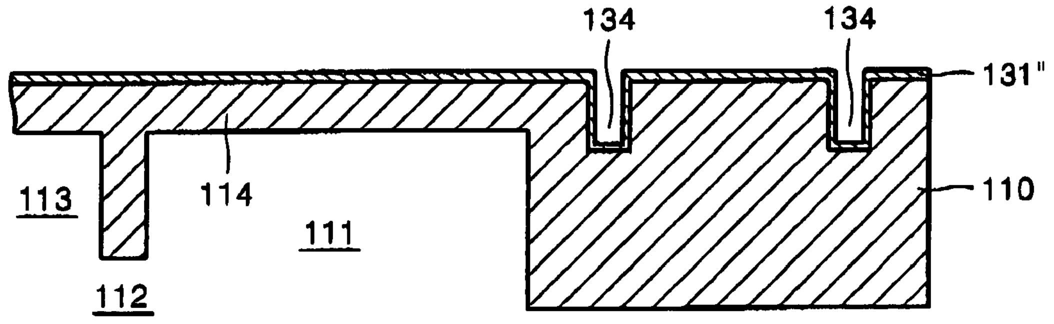

Referring to FIG. 5D, a second intermediate insulating layer 131", e.g., a silicon oxide layer, is deposited on an upper surface of the flow path plate 110 and an inner surface of the trench 134. At this time, as described above, the silicon oxide layer 131" may be deposited by PECVD. As a result, as shown in FIG. 5D, the silicon oxide layer 131" is formed to a greater thickness on the upper surface of the flow path plate 110 than on the inner surface of the trench 134.

Figure 5E:
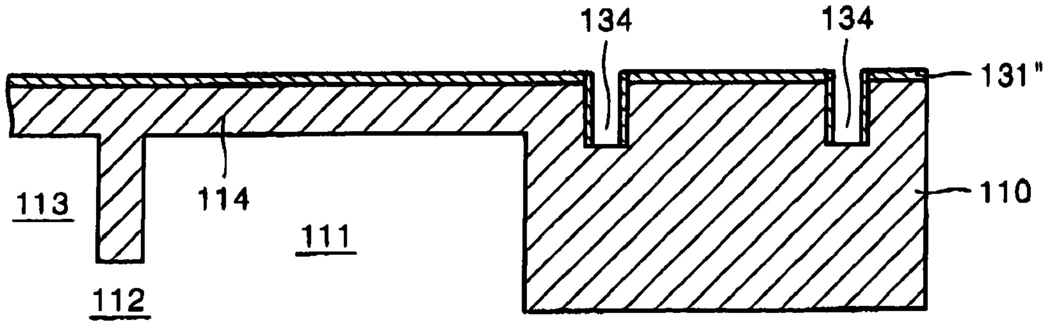

Referring to FIG. 5E, the silicon oxide layer 131" formed on an inner bottom surface of the trench 134 is etched to expose the flow path plate 110. The entire surface of the silicon oxide layer 131" may be anisotropically dry etched by Ion Beam Etching (IBE). As a result of this etching, a portion of the silicon oxide layer 131" formed to a greater thickness on the upper surface of the flow path plate 110 becomes thinner and a portion of the silicon oxide layer 131" formed on inner sidewalls of the trench 134 is barely etched. A portion of the silicon oxide layer 131" formed to a lesser thickness on the inner bottom surface of the trench 134, however, is completely etched, thereby exposing the flow path plate 110.

Figure 5F:
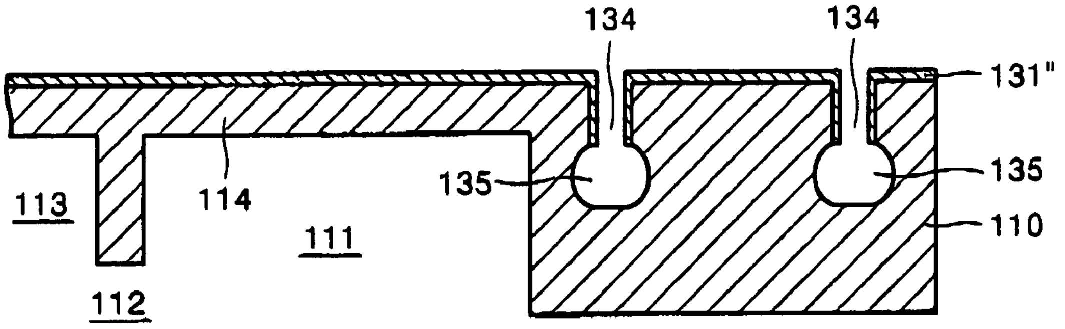

FIG. 5F illustrates the flow path plate 110 having the cavity 135 at the bottom surface of the trench 134. More specifically, an exposed portion of the flow path plate 110 at the bottom surface of the trench 134 is isotropically etched using a $SF_6$ gas supplied through the trench 134. As a result, as shown in FIG. 5F, the cavity 135 is formed wider than the trench 134 at the bottom surface of the trench 134. The cavity 135 may have an approximately circular section.

Figure 5G:
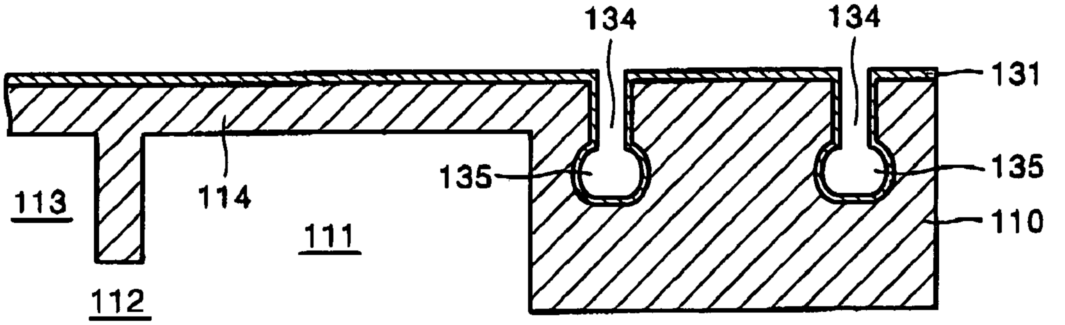

Referring to FIG. 5G, the flow path plate 110 is thermally oxidized to form the insulating layer 131, e.g., a silicon oxide layer, on an inner surface of the cavity 135.

Figure 5H:
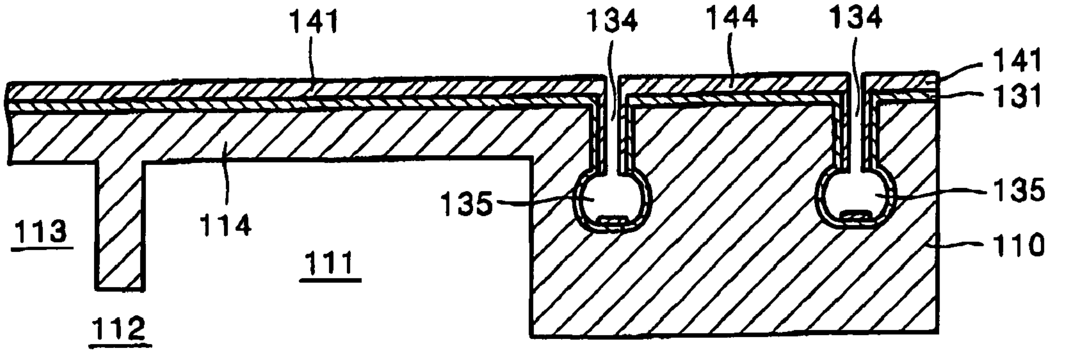

FIG. 5H illustrates the flow path plate 110 having the lower electrode 141 and the bonding pad 144 on the silicon oxide layer 131. As described above, the lower electrode 141 and the bonding pad 144 are formed as a conductive metal layer, and may preferably be a metal bi-layer composed of a Ti layer and a Pt layer. More specifically, a conductive metal material is deposited to a predetermined thickness on the entire surface of the silicon oxide layer 131 by sputtering. As a result, as shown in FIG. 5H, the metal material is deposited on an upper surface of the flow path plate 110 and an inner sidewall of the trench 134 but not on an inner sidewall of the cavity 135. Therefore, a metal material layer bounded by the trench 134 and a metal material layer formed beyond the trench 134 are insulated from each other. The metal material layer formed beyond the trench 134 forms the lower electrode 141 and the metal material layer bounded by the trench 134 forms the bonding pad 144. Thus, according to the first embodiment of the present invention, even when the lower electrode 141 and the bonding pad 144 are formed on the same plane using the same material, they may be insulated from each other by the trench 134 and the cavity 135.

Figure 5I:
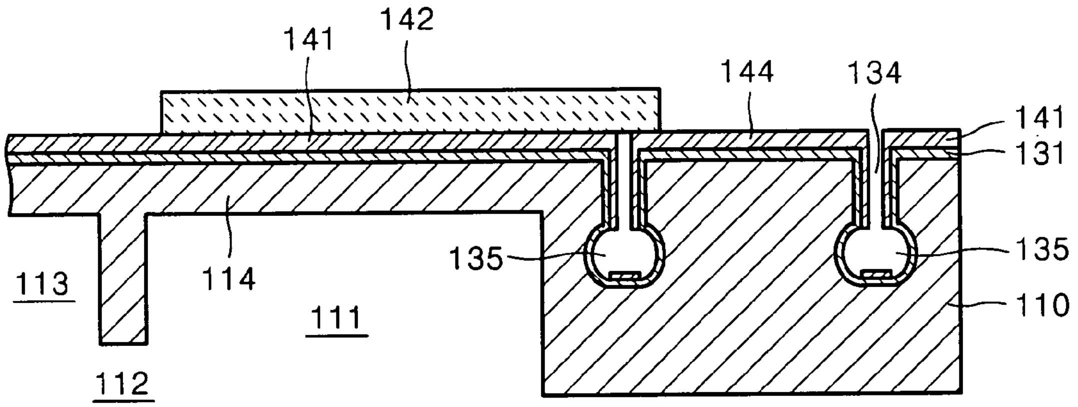

Referring to FIG. 5I, a piezoelectric material in a paste state is coated to a predetermined thickness on the lower electrode 141 by screen printing to form the piezoelectric layer 142. The piezoelectric layer 142 is positioned to correspond to the pressuring chamber 111 and an end of the piezoelectric layer 142 extends onto the bonding pad 144. At this time, since the piezoelectric material is in a paste state, it only slightly penetrates the trench 134 bounding the bonding pad 144. The piezoelectric material may be selected from various piezoelectric materials, e.g., a PZT ceramic material may preferably be used.

Figure 5J:
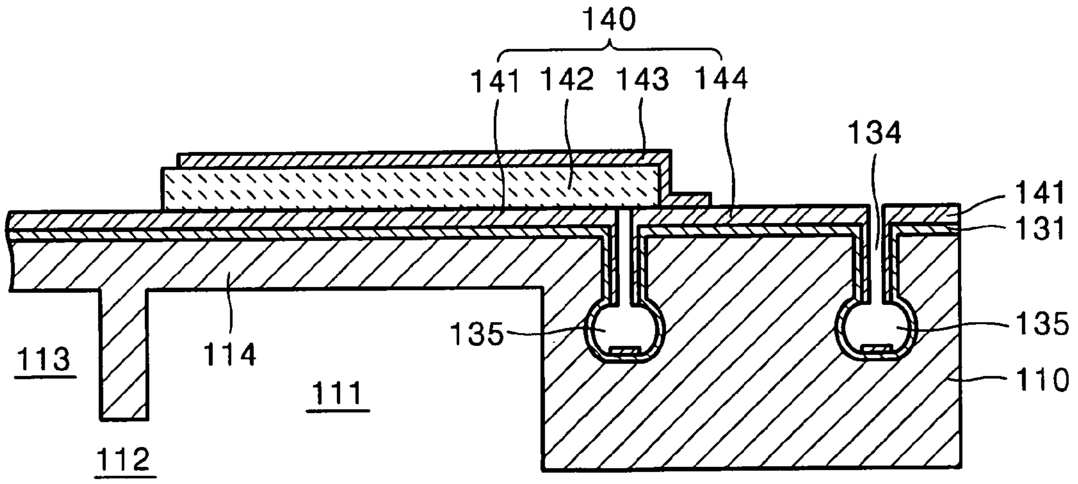

FIG. 5J illustrates the piezoelectric actuator 140 according to the first embodiment of the present invention completed by forming the upper electrode 143 on the piezoelectric layer 142. More specifically, the upper electrode 143 may be formed by screen printing a conductive metal material, e.g., a Ag—Pd paste, on the piezoelectric layer 142. An end of the upper electrode 143 extends beyond a corresponding end of the piezoelectric layer 142 and contacts an upper surface of the bonding pad 144.

The piezoelectric layer 142 and the upper electrode 143 are then sintered at a predetermined temperature, e.g., at about 900° to about 1,000° C., followed by poling in which an electric field is applied to the piezoelectric layer 142 to generate piezoelectric characteristics. This procedure completes the piezoelectric actuator 140 according to the first embodiment of the present invention.

FIGS. 6A through 6E illustrate cross-sectional views of sequential stages in a method of forming the piezoelectric actuator according to the second embodiment of the present invention shown in FIG. 4. Descriptions of aspects of the method of the second embodiment common to the first embodiment are only briefly provided.

Figure 6A:
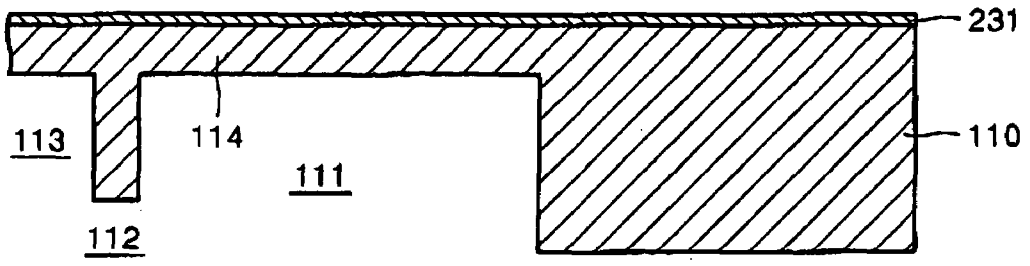
FIGS. 6A through 6E illustrate cross-sectional views of sequential stages in a method of forming the piezoelectric actuator according to the second embodiment of the present invention shown in FIG. 4.

Referring to FIG. 6A, the insulating layer 231, e.g., a silicon oxide layer, is formed on the flow path plate 110 having the pressurizing chamber 111 and the vibrating plate 114 by PECVD.

Figure 6B:
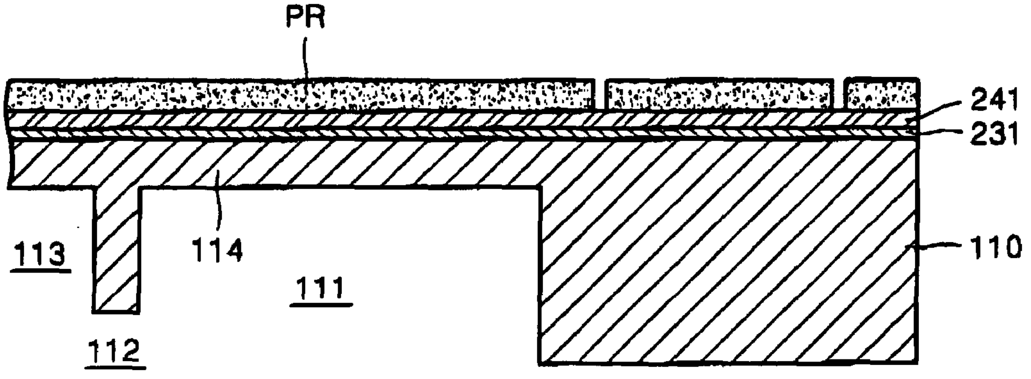

Referring to FIG. 6B, the lower electrode 241 is formed on the silicon oxide layer 231. More specifically, the lower electrode 241 may be formed as a metal bi-layer composed of a sequentially stacked Ti layer and Pt layer, as described above. The lower electrode 241 may be formed by respectively sputtering Ti and Pt to a predetermined thickness on the entire surface of the silicon oxide layer 231.

A photoresist PR is then coated on the entire surface of the lower electrode 241 and patterned to a predetermined pattern by photolithography.

Figure 6C:
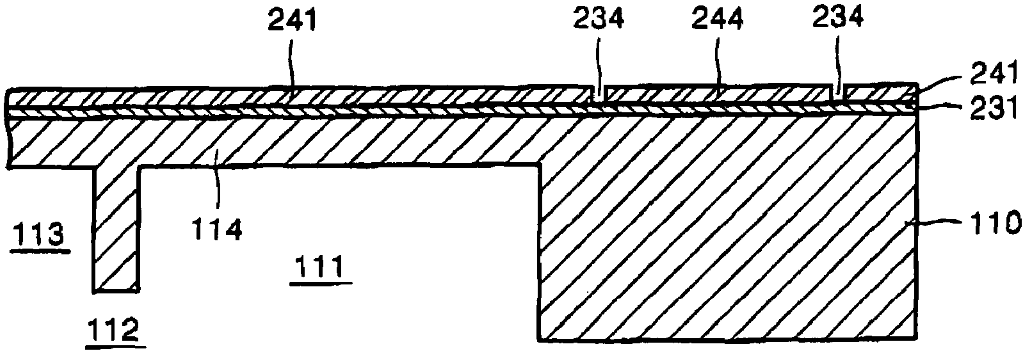

Referring to FIG. 6C, the lower electrode 241 is etched using the patterned photoresist PR as an etching mask to form the trench 234 extending through the lower electrode 241. As a result, the bonding pad 244 bounded by the trench 234, and insulated from the lower electrode 241, is defined.

According to the second embodiment of the present invention, the bonding pad 244 may be insulated from the lower electrode 241 by a less complicated process, as compared to the above-described first embodiment.

Figure 6D:
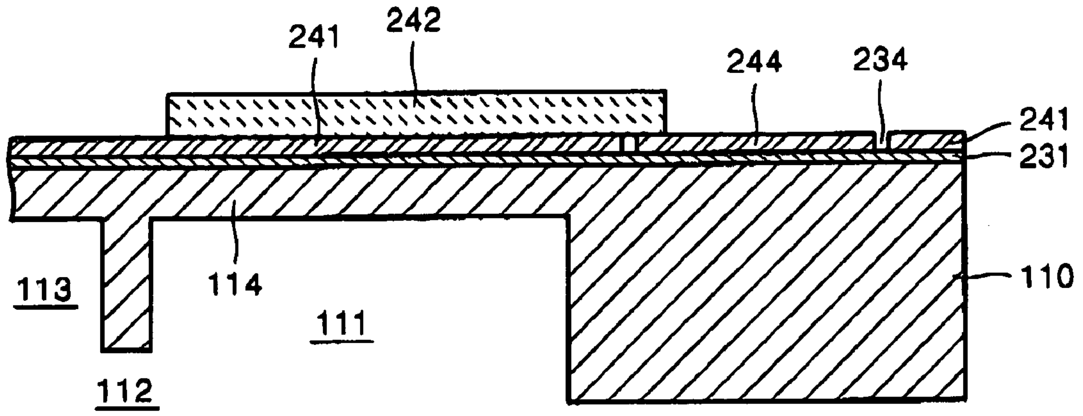

FIG. 6D illustrates the flow path plate 110 having the piezoelectric layer 242 on the lower electrode 241. The formation of the piezoelectric layer 242 in the second embodiment is the same as in connection with the above-described first embodiment. More specifically, the piezoelectric layer 242 is positioned to correspond to the pressurizing chamber 111 and an end of the piezoelectric layer 242 extends onto the bonding pad 244.

Figure 6E:
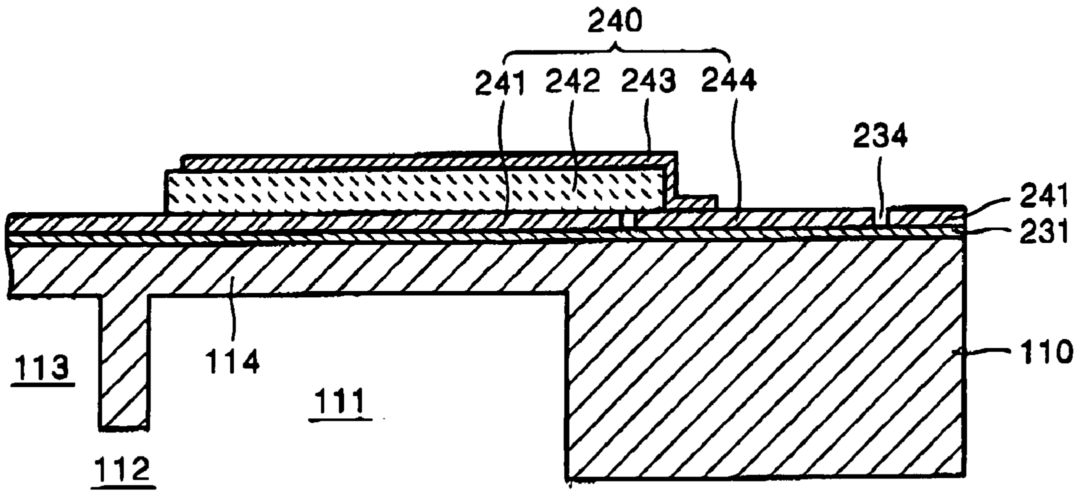

FIG. 6E illustrates the flow path plate 110 having the upper electrode 243 on the piezoelectric layer 242. The formation of the upper electrode 243 in the second embodiment is the same as in the above-described first embodiment. More specifically, an end of the upper electrode 243 extends beyond a corresponding end of the piezoelectric layer 242 and contacts an upper surface of the bonding pad 244.

When the piezoelectric layer 242 and the upper electrode 243 are then subjected to sintering and poling, the piezoelectric actuator 240 according to the second embodiment of the present invention is completed, as shown in FIG. 6E.

As apparent from the above description, according to a piezoelectric actuator for an ink-jet printhead of the present invention, bonding pads insulated from a lower electrode are arranged on a flow path plate. Therefore, upper electrodes and a driving circuit for applying a voltage can be electrically connected by the bonding pads, thereby decreasing the areas of piezoelectric layers. As a result, the capacitance and electric load of the piezoelectric layers decrease, thereby enhancing the response speed and durability of the actuator. Furthermore, the enhanced response speed increases the ejection speed of ink droplets through nozzles, thereby increasing a driving frequency.

In addition, according to an embodiment of the present invention, since the driving circuit is bonded to the bonding pads made of a conductive metal material, a more firm and stable connection between the actuator and the driving circuit may be readily accomplished, thereby enhancing durability.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A piezoelectric actuator for an ink-jet printhead, formed on a flow path plate having a pressurizing chamber, the piezoelectric actuator for applying a driving force for ink ejection to the pressurizing chamber, the piezoelectric actuator comprising:

a lower electrode on the flow path plate;

a bonding pad on the flow path plate to be insulated from the lower electrode, wherein a driving circuit for voltage application is bonded to an upper surface of the bonding pad;

a piezoelectric layer on the lower electrode at a position corresponding to the pressurizing chamber, wherein an end of the piezoelectric layer extends onto the bonding pad;

an upper electrode directly on an upper surface of the piezoelectric layer, wherein an end of the upper electrode extends beyond the end of the piezoelectric layer to be in direct contact with an entire side surface of the piezoelectric layer and in direct contact with the upper surface of the bonding pad; and a trench bounding the bonding pad, the trench extending through the lower electrode, wherein the bonding pad is insulated from the lower electrode by the trench, and the trench extends from an upper surface of the lower electrode to a predetermined depth in the flow path plate, the predetermined depth of the trench being sufficient to overlap a portion of the pressurizing chamber, and the trench including a cavity at a bottom surface of the trench.

2. The piezoelectric actuator as claimed in claim 1, wherein the cavity has an approximately circular section.

3. The piezoelectric actuator as claimed in claim 1, further comprising an insulating layer between the flow path plate and the lower electrode, a portion of the insulating layer being on inner sidewalls of the trench.

4. The piezoelectric actuator as claimed in claim 1, wherein the lower electrode and the bonding pad are formed on a same plane using a same metal material.

5. The piezoelectric actuator as claimed in claim 4, wherein the lower electrode and the bonding pad have a bi-layer structure composed of a sequentially stacked titanium (Ti) layer and platinum (Pt) layer.

6. The piezoelectric actuator as claimed in claim 1, wherein the bonding pad has a substantially square shape.

7. The piezoelectric actuator as claimed in claim 1, wherein a width of the bonding pad is greater than a width of the piezoelectric layer.

8. A method of forming a piezoelectric actuator for an ink-jet printhead, formed on a flow path plate having a pressurizing chamber, the piezoelectric actuator for applying a driving force for ink ejection to the pressurizing chamber, the method comprising:

forming a lower electrode on the flow path plate;

forming a bonding pad insulated from the lower electrode on the flow path plate;

attaching a driving circuit for voltage application to an upper surface of the bonding pad;

forming a piezoelectric layer on the lower electrode at a position corresponding to the pressurizing chamber so that an end of the piezoelectric layer extends onto the bonding pad;

forming an upper electrode directly on an upper surface of the piezoelectric layer so that an end of the upper electrode extends beyond the end of the piezoelectric layer to be in direct contact with an entire side surface of the piezoelectric layer and in direct contact with the upper surface of the bonding pad; and forming a trench bounding the bonding pad, the trench extending through the lower electrode, wherein the bonding pad is insulated from the lower electrode by the trench, and the trench extends from an upper surface of the lower electrode to a predetermined depth in the flow path plate, the predetermined depth of the trench being sufficient to overlap a portion of the pressurizing chamber, and the trench including a cavity at a bottom surface of the trench.

9. The method as claimed in claim 8, wherein forming the lower electrode and the bonding pad comprises:

forming a first intermediate insulating layer on the flow path plate;

patterning the first intermediate insulating layer to a predetermined pattern;

etching a portion of the flow path plate exposed through the patterned first intermediate layer to "the predetermined depth to form the trench"

forming a second intermediate insulating layer on an inner surface of the trench;

etching a portion of the second intermediate insulating layer formed on the bottom surface of the trench;

etching an exposed portion of the flow path plate at the bottom surface of the trench to form the cavity having a width greater than a width of the trench;

forming an insulating layer on an inner surface of the cavity; and depositing a conductive metal material on the insulating layer formed on the flow path plate to form the lower electrode beyond the trench and to form the bonding pad bounded by the trench and insulated from the lower electrode by the trench and the cavity.

10. The method as claimed in claim 9, wherein etching the portion of the flow path plate exposed through the patterned first intermediate layer to a predetermined depth to form the trench comprises anisotropically dry etching using Reactive Ion Etching (RIB).

11. The method as claimed in claim 9, wherein etching the portion of the second intermediate insulating layer formed on the bottom surface of the trench comprises anisotropically dry etching using Ion Beam Etching (IBE).

12. The method as claimed in claim 9, wherein etching the exposed portion of the flow path plate at the bottom surface of the trench comprises isotropic etching through the trench to form the cavity to have an approximately circular section.

13. The method as claimed in claim 9, wherein forming the first and second intermediate insulating layers comprises performing Plasma Enhanced Chemical Vapor Deposition (PECVD) and forming the insulating layer comprises performing thermal oxidation.

14. The method as claimed in claim 8, wherein forming the lower electrode and the bonding pad comprises:

forming an insulating layer on the flow path plate;

depositing a conductive metal material on the insulating layer to form the lower electrode; and etching the lower electrode to a predetermined pattern to form the trench extending through the lower electrode to form the bonding pad that is bounded by the trench and insulated from the lower electrode by the trench.

15. The method as claimed in claim 8, wherein forming the piezoelectric layer comprises:

screen printing a piezoelectric paste on an upper surface of the lower electrode at a position corresponding to the pressurizing chamber and a portion of an upper surface of the bonding pad; and sintering.

16. The method as claimed in claim 8, wherein forming the upper electrode comprises:

screen printing a conductive metal paste on an upper surface of the piezoelectric layer and a portion of an upper surface of the bonding pad; and sintering.

* * * * *